United States Patent
Yazawa et al.

(10) Patent No.: US 7,566,198 B2
(45) Date of Patent: Jul. 28, 2009

(54) INDUSTRIAL ROBOT

(75) Inventors: Takayuki Yazawa, Nagano (JP); Yasunori Takeuti, Nagano (JP); Hiroto Nakajima, Nagano (JP); Hirokazu Watanabe, Nagano (JP)

(73) Assignee: Nidec Sankyo Corporation (JP)

( * ) Notice: Subject to any disclaimer, the term of this patent is extended or adjusted under 35 U.S.C. 154(b) by 273 days.

(21) Appl. No.: 11/633,214

(22) Filed: Dec. 4, 2006

(65) Prior Publication Data
US 2007/0151388 A1 Jul. 5, 2007

(30) Foreign Application Priority Data
Dec. 5, 2005 (JP) ............................. 2005-351324

(51) Int. Cl.
*B66C 23/00* (2006.01)

(52) U.S. Cl. ............................. 414/744.5; 318/568.16; 700/245; 901/9; 901/15

(58) Field of Classification Search ............. 414/744.5, 414/744.7, 744.6; 318/649, 568.1, 568.6, 318/568.11, 568.16; 74/490.03, 490.04; 901/9, 15, 21, 23, 24; 700/245
See application file for complete search history.

(56) References Cited

U.S. PATENT DOCUMENTS 3,247,978 A * 4/1966 Neumeier .................... 414/735
4,829,840 A * 5/1989 Torii et al. ............... 74/490.03
4,897,015 A * 1/1990 Abbe et al. .............. 414/744.8

FOREIGN PATENT DOCUMENTS

| JP | 7-142551 | 6/1995 |
| JP | 11-226883 | 8/1999 |

* cited by examiner

*Primary Examiner*—Donald Underwood
(74) *Attorney, Agent, or Firm*—Cantor Colburn LLP (57) ABSTRACT

An industrial robot may include a main body part and an arm part including a first arm, a second arm and a hand arm. The main body part is provided with a first turnable shaft for performing an expansion-contraction operation of the arm part, a second turnable shaft which is disposed within the first turnable shaft for changing an expansion-contraction direction of the hand arm together with the first arm, a first sensor mechanism including a first sensor for detecting a home position of the second turnable shaft, a second sensor mechanism provided in the second turnable shaft and which includes a second sensor for detecting a relative home position between the second turnable shaft and the first turnable shaft, and a rotary joint which is connected with the second turnable shaft and is electrically connected with the second sensor.

9 Claims, 11 Drawing Sheets

INDUSTRIAL ROBOT

CROSS REFERENCE TO RELATED APPLICATION

The present invention claims priority under 35 U.S.C. §119 to Japanese Application No. 2005-351324 filed Dec. 5, 2005, which is incorporated herein by reference.

FIELD OF THE INVENTION

The present invention relates to an industrial robot. More specifically, the present invention relates to an industrial robot which has no limitation in an arm turning quantity and which is used, for example, under a reduced pressure atmosphere for a semiconductor producing equipment or the like.

BACKGROUND OF THE INVENTION

A work-piece carrying robot or wafer transfer robot is typically incorporated in a producing system for a semiconductor device. Such a producing system includes a plurality of chambers for processing under a reduced pressure atmosphere. The work-piece carrying robot is operated such that a semiconductor wafer is put in and out of a specified chamber among a plurality of the chambers. In this case, when the specified chamber is returned to a normal pressure state each time a semiconductor wafer is carried in and out of the chamber, much time is required to depressurize the chamber again and start processing, which cause decreased throughput. Therefore, in recent years, a producing system has been commonly employed in which a space including a work-piece carrying robot for carrying-in/carrying-out a semiconductor wafer to and from respective chambers is set to be a preliminary depressurized chamber (referred to as a load lock chamber). According to the producing system described above, a semiconductor wafer can be carried-in/carried-out without returning the inside of the chamber to a normal pressure state and thus the throughput is increased.

Various work-piece carrying robots aiming to improve a carrying efficiency and to shorten an operating time have been proposed as a work-piece carrying robot which is used in the above-mentioned producing system. For example, in Japanese Patent Laid-Open No. Hei 7-142551, a carrier arm device is proposed which includes a first arm part which is supported turnably, a second arm part which is turnably supported at a tip end of the first arm part, and a third arm part whose center portion is turnably supported at a tip end of the second arm part. A work-piece placing part for being placed and holding a work-piece is formed at both ends of the third arm part so that two work-pieces can be handled at a time.

Further, for example, in Japanese Patent Laid-Open No. Hei 11-226883, a carrier robot is proposed in which limitation of an arm turning quantity is improved to enhance throughput. In this carrier robot, a moving member is provided which reciprocates over a specified range corresponding to rotation of a shaft by a drive source and the moving range of the moving member is restricted by a sensor part in order to restrict a turning range of the moving member. In this carrier robot, a sensor is arranged so as to be capable of corresponding to a rotational angle of 360 degrees or more of the shaft and thus this patent reference describes that the moving member can be accessed in either direction.

In the carrier arm device as described in the former patent reference, motors are respectively connected to three drive shafts which are a turning shaft, an expansion-contraction shaft, and a third arm turning shaft. However, no turning controls for the respective drive shafts are described in this reference, and it is conceived that a stepping motor is provably used to enhance a turning accuracy. In this case, reduction gear ratio cannot be increased and cost for the device increases.

Further, in the carrier robot described in the latter patent reference, a turning quantity of its arm is improved but unlimited turning is not possible and the turning quantity is limited by a length of a spiral-shaped groove that is formed on a cam member. Accordingly, when turning is performed as restricted in one direction like an operation in the load lock chamber, the arm is required to be turned reversely once per several times and thus a time loss occurs and throughput is not improved.

SUMMARY OF THE INVENTION

In view of the problems described above, an embodiment of the present invention may advantageously provide an industrial robot at a low cost which has no limitation in an arm turning quantity.

Thus, according to an embodiment of the present invention, there may be provided an industrial robot including a main body part, an arm part having a first arm, a second arm and a hand arm which are connected in this order from the main body part side and which is turnably driven to expand and contract so that the hand arm is moved in one direction, a first turnable shaft (specifically, a hollow turnable shaft) which is disposed in the main body part for performing an expansion-contraction operation of the arm part, a second turnable shaft (specifically, a solid turnable shaft) which is disposed within the first turnable shaft for changing an expansion-contraction direction of the hand arm together with the first arm, a first sensor mechanism which is provided in the main body part and which includes a first sensor for detecting a home position of the second turnable shaft, a second sensor mechanism which is provided in the second turnable shaft and which includes a second sensor for detecting a relative home position between the second turnable shaft and the first turnable shaft, and a rotary joint which is connected with the second turnable shaft and the rotary joint is electrically connected with the second sensor. In this case, the first sensor mechanism may include a first rotary member which causes the first sensor to generate an ON/OFF signal by every 180° and the second sensor mechanism may include a second rotary member which causes the second sensor to generate an ON/OFF signal by every 180°.

According to an embodiment of the present invention, the main body part is provided with a first sensor mechanism including a first sensor for detecting a home position of the second turnable shaft, and a second sensor mechanism which is provided in the second turnable shaft and which includes a second sensor for detecting a relative home position between the second turnable shaft and the first turnable shaft. In addition, a rotary joint is connected with the second turnable shaft and the rotary joint is electrically connected with the second sensor. Therefore, expansion-contraction of the arm part and turning of the arm part can be performed by two sensor mechanisms with a high degree of positional accuracy. Moreover, since power feeding to the sensor mechanism is performed through the rotary joint which is connected to the second turnable shaft, an endless turning can be performed in a clockwise direction or in a counterclockwise direction and thus a conventional time loss due to a reverse turning once in several times is not required and throughput can be improved. Further, the expansion-contraction and the turning of the arm part are performed by turning two shafts and thus the number of the shafts for turning and controlling is reduced and the device structure is advantageous in terms of costs.

In an industrial robot in accordance with an embodiment of the present invention, the second turnable shaft is driven by a servomotor which includes a reduction mechanism and a rotary encoder whose output signal is "$2^n$" ("n" power of 2).

According to this embodiment, the second turnable shaft (for example, a solid turnable shaft) is driven by a servomotor which includes a reduction mechanism and a rotary encoder. Therefore, when a counter for the rotary encoder is reset, the solid turnable shaft (similar to the arm part) can be always returned to the state after integral turning based on the relationship of the reduction gear ratio. As a result, the position of the arm part at the time of resetting of the counter becomes the same as the initial home position, and thus the turning quantity detected with the rotary encoder afterwards and the positional judgment of the solid turnable shaft which is judged by the first and second sensor mechanisms can be performed in the same manner as before the counter reset. Accordingly, the expansion-contraction and the turning of the arm part can be performed without causing the home position to be inaccurate before and after the resetting even when used for a long time. Since the mechanical control mechanism described above is not based on a control software, it is advantageous in terms of costs and a control can be performed with a high degree of reliability.

In this embodiment, it is preferable that a reduction gear ratio of the reduction mechanism is set to be "1/128" and an output signal of the rotary encoder is "$2^n$". According to this embodiment, the above-mentioned effects can be specifically realized by utilizing the rotary encoder whose output signal is "$2^n$" and the reduction mechanism whose reduction gear ratio is set to be "1/128".

In an industrial robot in accordance with an embodiment of the present invention, the first arm comprises a first pulley which is connected to the second turnable shaft on the main body part side, a second pulley which is disposed on the second arm side and connected with the second arm, and a first belt which is stretched over the first pulley and the second pulley, and the second arm comprises a third pulley which is disposed at a concentric position with the second pulley, a fourth pulley which is disposed on the hand arm side and connected with the hand arm, and a second belt which is stretched over the third pulley and the fourth pulley. According to this embodiment, an expansion-contraction operation is performed by the first arm and the second arm by means of that the second turnable shaft is driven and the expansion-contraction direction of the hand arm can be changed by turning the first arm and the second arm by means of that the first turnable shaft and the second turnable shaft are driven without changing their relative positional relationship. In this case, it is preferable that the first turnable shaft is connected with the first arm to turnably drive the first arm, a turning angle ratio of the first pulley, the second pulley and the fourth pulley is set to be "1:2:1", and the arm part performs an expansion-contraction operation with a direction of the hand arm being maintained constant when only the first turnable shaft is turnably driven.

In an industrial robot in accordance with an embodiment of the present invention, it is preferable that a magnetic seal is provided between the solid turnable shaft and the hollow turnable shaft, and another magnetic seal is provided between the hollow turnable shaft and a hollow fixed shaft which is disposed on an outer peripheral side of the hollow turnable shaft. According to this embodiment, since a magnetic seal is provided between the respective shafts, the industrial robot is preferably used under a reduced pressure atmosphere, for example, in a semiconductor producing equipment.

In an industrial robot in accordance with an embodiment of the present invention, it is preferable that a drive source is provided for moving the first turnable shaft and the second turnable shaft in a height direction.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE PREFERRED EMBODIMENTS

An embodiment of the present invention will be described below with reference to the accompanying drawings. An industrial robot of the present invention is not limited to the following description and drawings.

Figure 2:
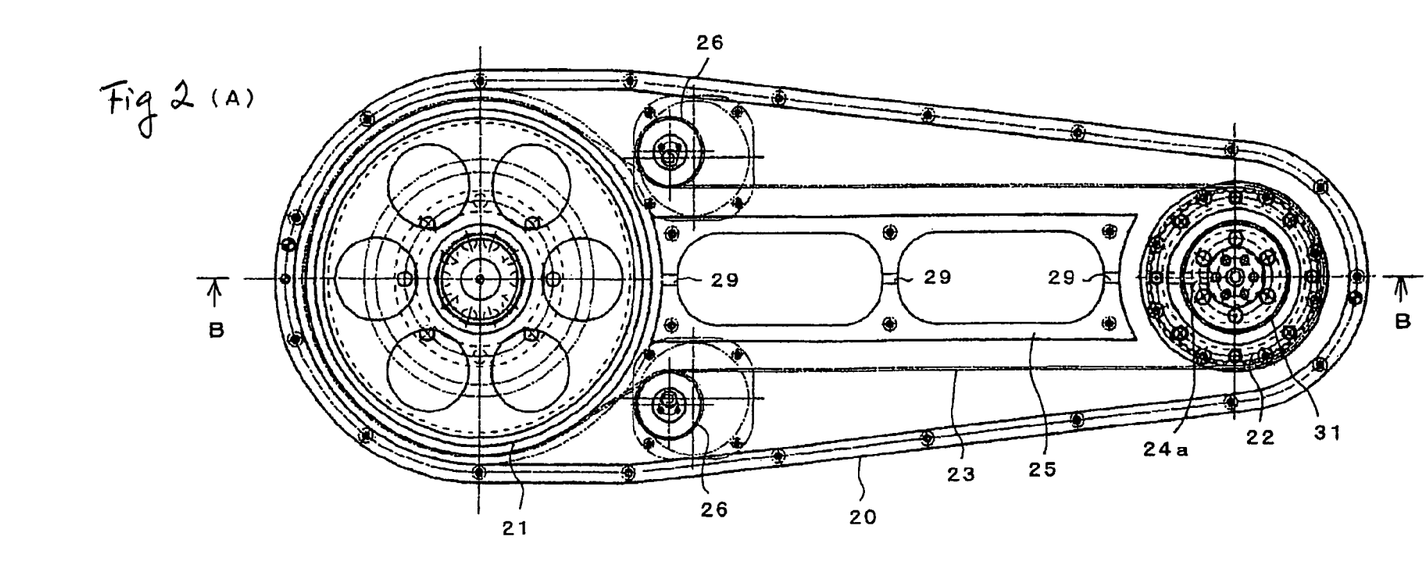
FIG. 2(A) is a plan view showing an internal structure of a first arm shown in FIGS. 1(A) and 1(B)
FIG. 2(B) is its "B-B" cross-sectional view.
Figure 3:
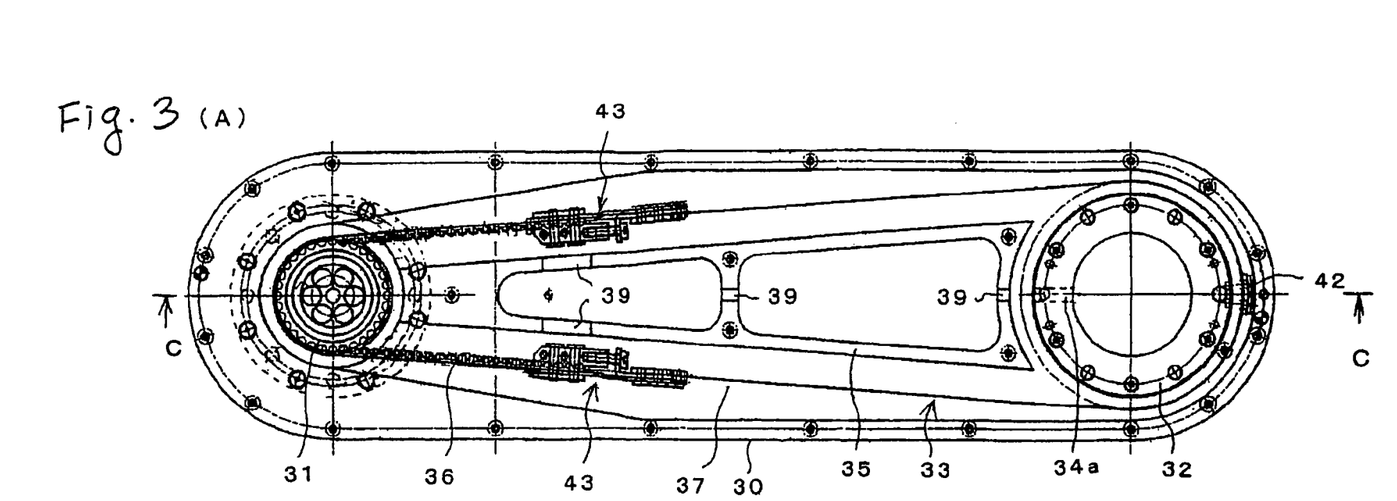
FIG. 3(A) is a plan view showing an internal structure of a second arm shown in FIGS. 1(A) and 1(B)
FIG. 3(B) is its "C-C" cross-sectional view.
Figure 4:
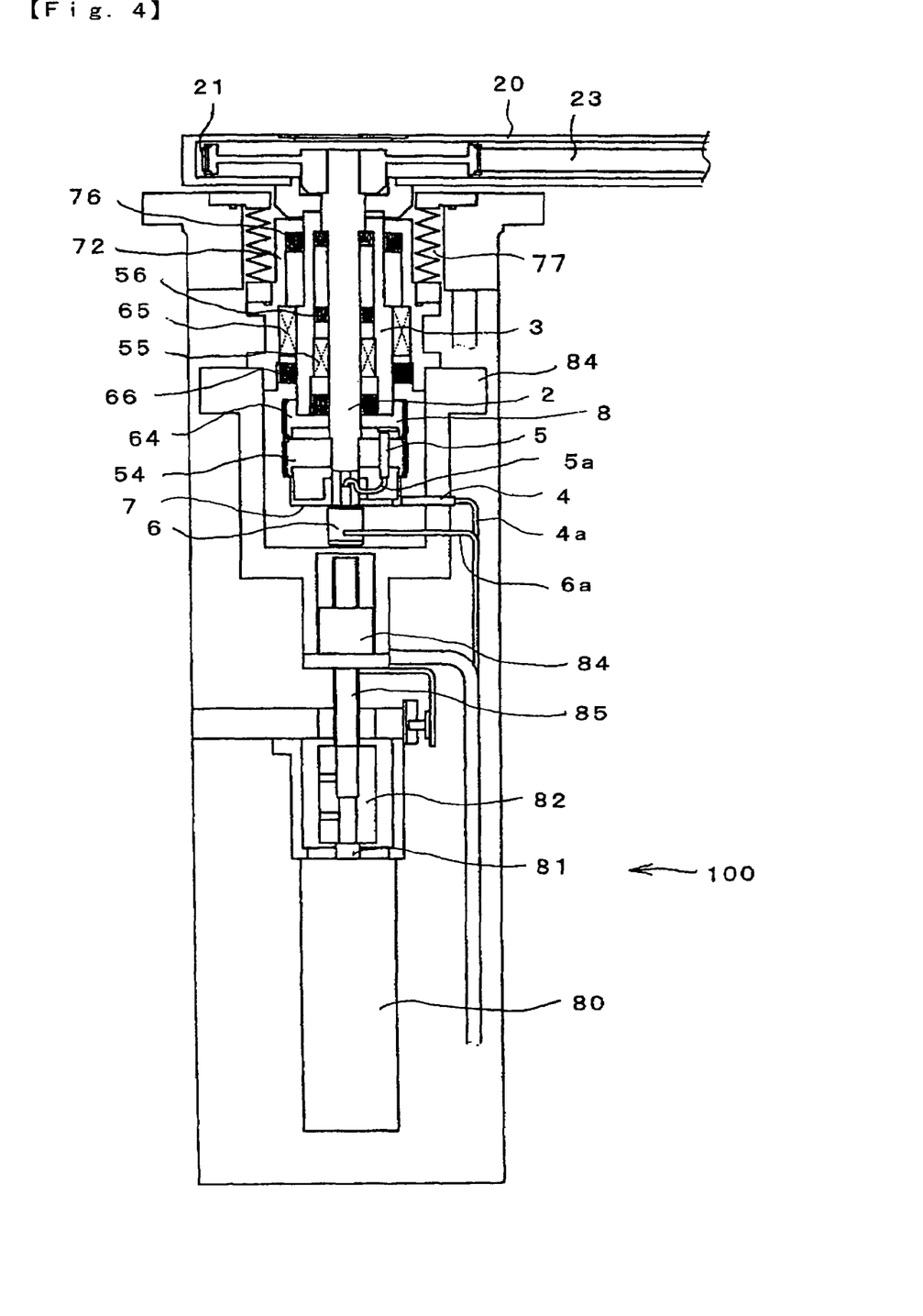
FIG. 4 is an enlarged view of "A-A" cross section of a main body part shown in FIG. 1(A).
Figure 5:
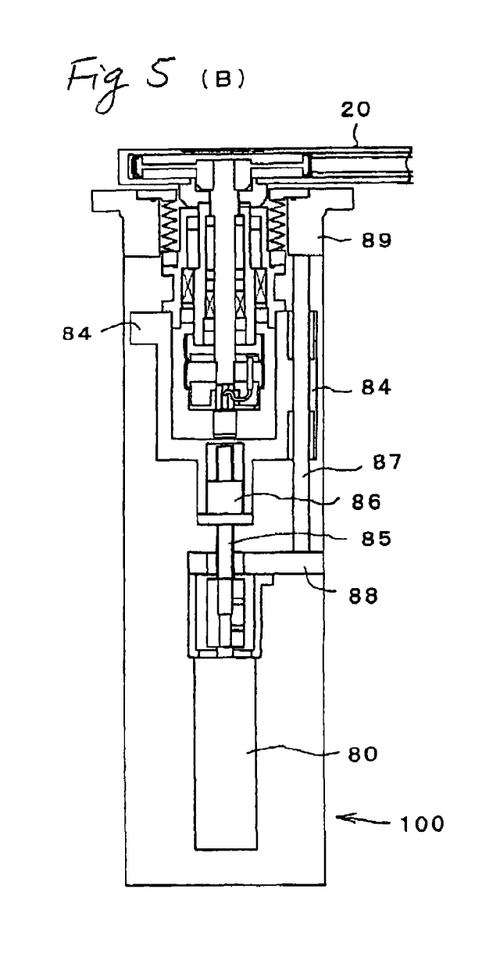
FIG. 5(A) is a cross-sectional view of the main body part of the industrial robot which is viewed at the different angle of 120° from the position shown in FIG. 1(B) and FIG. 5(B) is its cross-sectional view which is viewed at the different angle of 240°.
Figure 6:
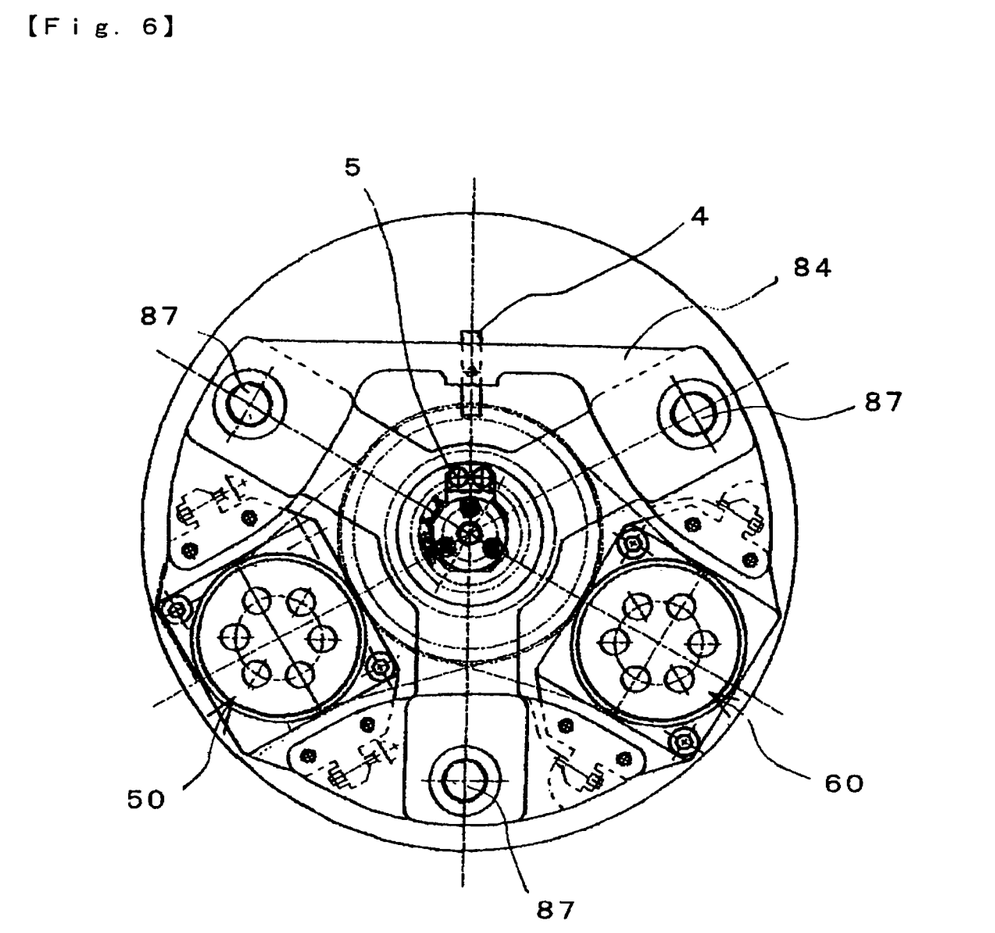
FIG. 6 is a transverse cross-sectional view of a main body part of an industrial robot in accordance with an embodiment of the present invention.

FIG. 1(A) is a plan view showing an industrial robot in accordance with an embodiment of the present invention and FIG. 1(B) is its "A-A" cross-sectional view. FIG. 2(A) is a plan view showing an internal structure of a first arm shown in FIGS. 1(A) and 1(B), and FIG. 2(B) is its "B-B" cross-sectional view. FIG. 3(A) is a plan view showing an internal structure of a second arm shown in FIGS. 1(A) and 1(B), and FIG. 3(B) is a "C-C" cross-sectional view. FIG. 4 is an enlarged view of "A-A" cross section of a main body part shown in FIG. 1(A). FIG. 5(A) is a cross-sectional view of the main body part of the industrial robot which is viewed at the different angle of 120° from the position shown in FIG. 1(B) and FIG. 5(B) is its cross-sectional view which is viewed at the different angle of 240°. FIG. 6 is a transverse cross-sectional view of a main body part of an industrial robot in accordance with an embodiment of the present invention.

Figure 1:
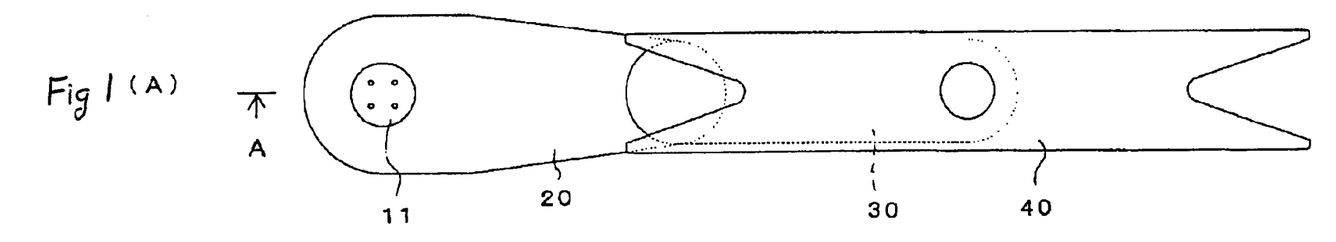
FIG. 1(A) is a plan view showing an industrial robot in accordance with an embodiment of the present invention and FIG. 1(B) is its "A-A" cross-sectional view.

An industrial robot (hereinafter, referred to as "robot 1") in accordance with an embodiment of the present invention includes, as shown in FIG. 1, an arm part 10 and a main body part 100. The arm part 10 comprises a first arm 20, a second arm 30 and a hand arm 40 which are connected in this order from the main body part side, and the arm part 10 is turnably driven such that the hand arm 40 is expanded and contracted in a certain direction. The main body part 100 is provided with a hollow turnable shaft 3, which is a first turnable shaft, for performing an expansion and contraction operation of the arm part 10 and a solid turnable shaft 2 which is a second turnable shaft and is disposed within the hollow turnable shaft 3 and is connected with the first arm 20 for changing the expansion and contraction direction of the hand arm 40.

First, the arm part 10 will be described below. As shown in FIGS. 2(A) and 2(B) and FIGS. 3(A) and 3(B), the arm part 10 is structured such that the first arm 20, the second arm 30 and the hand arm 40 are connected in this order from the main body part side, and the arm part 10 is turnably driven such that the hand arm 40 is expanded and contracted in a certain direction. The hand arm 40 is an arm part for mounting and carrying a work-piece such as a wafer and may be formed to have a mounting part at each of its both ends as shown in FIG. 1(A) or may be formed to have a mounting part only at one end.

The first arm 20 includes a first pulley 21 which is connected with a solid turnable shaft 2 arranged on the main body part side, a second pulley 22 which is arranged on the second arm 30 side and is connected with and fixed to the second arm 30, and a first belt 23 which is stretched over the first pulley 21 and the second pulley 22. The second arm 30 includes a third pulley 31 disposed at a concentric position with the second pulley 22, a fourth pulley 32 which is arranged on the hand arm 40 side and is connected with and fixed to the hand arm 40, and a second belt 33 which is stretched over the third pulley 31 and the fourth pulley 32. In accordance with an embodiment of the present invention, when only the hollow turnable shaft 3 is driven, an expansion and contraction operation of the arm part 10 is performed by the first arm 20 and the second arm 30 and, when both the solid turnable shaft 2 and the hollow turnable shaft 3 are driven without changing their relative position, the direction of an expansion and contraction of the hand arm 40 is changed by turning the first arm 20 and the second arm 30.

The material of a belt which is used in the first arm 20 and the second arm 30 is not limited. A steel band belt and a rubber belt such as a chloroprene belt, a nitrile rubber belt and a urethane rubber belt may be used and a hybrid belt which is combined with steel band belt and rubber belt may be used. When the robot 100 in accordance with an embodiment of the present invention is used in a reduced pressure atmosphere, a belt which generates little gas and dust is preferably used and, for example, a fluororubber belt or the like may be used. Further, as for a belt shape, a flat belt, a toothed belt, and a hybrid belt combined with a flat belt and a toothed belt may be used. The shape of each pulley is selected depending on the type of a belt to be used. A flat pulley is used in the case of a flat belt and a toothed pulley is used for a toothed belt.

In order to set the first belt 23 which is stretched over the first pulley 21 and the second pulley 22 in an appropriate tension, idler pulleys 26 for pressing the first belt 23 from its back face may be disposed as shown in FIG. 2(A). The idler pulley 26 is provided with a mechanism which is capable of performing a fine adjustment. The tension of the first belt 23 is adjusted by the idler pulleys 26, which enable a contacting angle between the first pulley 21 and the first belt 23 to be further increased.

The second belt 33 shown in FIG. 3(A) is a hybrid belt which is combined with a toothed belt 36 (timing belt) and a steel flat belt 37 and both the belts are connected each other with a connection part 43. In the connection part 43, a tension adjustable mechanism is preferably provided in one or both of the belts. In accordance with an embodiment of the present invention, detail descriptions of the connection part and the hybrid belt are omitted but the moving range of the connection part provided in the hybrid belt is determined such that the connection part does not contact with the pulleys on both sides.

Ribs 25, 35 as shown in FIG. 2(A) and FIG. 3(A) may be formed in the inside of the first arm 20 and the second arm 30. The ribs 25, 35 work to enhance the rigidity of each arm to restrain its deformation and thus it is advantageous that the wall thickness of the arm can be made thinner to reduce its weight. Exhaust holes 29, 39 in communication with the base end portion of the first arm 20 are preferably formed in the ribs 25, 35. The exhaust holes 29, 39 serve as a passage way for exhausting air in the first arm 20 and air in the second arm 30 to the outside from the base end portion of the first arm 20. When the robot 1 is exposed in a reduced pressure atmosphere, the air in the second arm 30 enters into the first arm 20 from the base end portion of the second arm 30 through the exhaust hole 39 and then passes through the exhaust hole 29 in the first arm 20 to be easily exhausted from the base end portion of the first arm 20 to the outside. The base end portion of the first arm 20 is a portion on the main body part 100 side and, in accordance with an embodiment of the present invention, the base end portion is a portion above the shafts provided in the main body part for driving the arm part 10. An opening part for exhausting air in the arm part 10 to the outside is formed in the base end portion. A filter 11 for not exhausting dust which is generated in the arm to the reduced pressure atmosphere is attached to the opening part.

Figure 9:
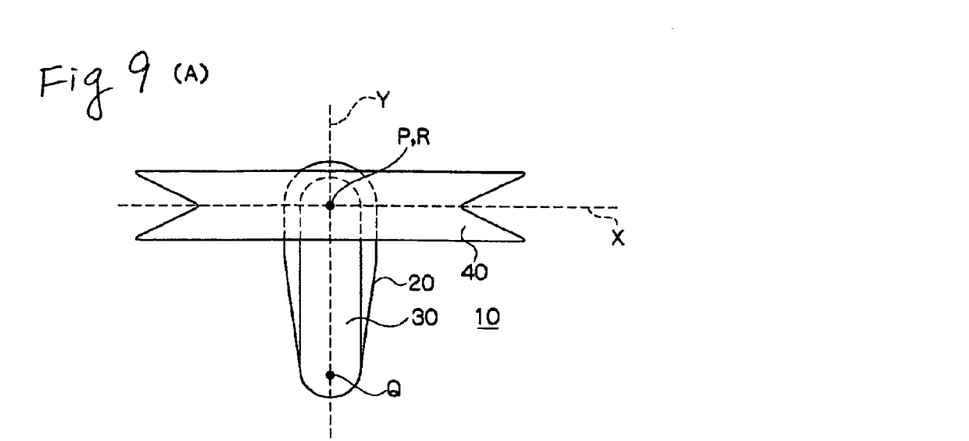
FIGS. 9(A), 9(B) and 9(C) are explanatory views showing an expansion-contraction operation of an arm part

The diameter "R1" of the first pulley 21 and the diameter "R2" of the second pulley 22 are set to be a relationship of "R1:R2=2:1", and the diameter "R3" of the third pulley 31 and the diameter "R4" of the fourth pulley 32 are set to be a relationship of "R3:R4=1:2". Therefore, the ratio of the angle of rotation of the first pulley 21, the second pulley 22 (the third pulley 31) and the fourth pulley 32 becomes "1:2:1", and thus the ratio of the rotation angle of the first pulley 21, the second pulley 22 (the third pulley 31) and the fourth pulley 32 becomes "1:2:1". As a result, as shown in FIG. 9, when the first pulley 21 and the second pulley 22 are relatively turned by turning the first arm 20 such that the state shown in FIG. 9(A) is changed to the states shown in FIG. 9(B) and FIG. 9(C), an angle between the first arm 20 and the second arm 30 varies, but the hand arm 40 moves so as to expand or contract along the straight line (imaginary line "X"), which is connected the center point P of the first pulley 21 of the first arm 20 with the center point R of the fourth pulley 32 of the second arm 30, while the direction of the hand arm 40 maintains to be unchanged.

Next, the main body part 100 will be described below. As shown in FIGS. 4 through 6, the main body part 100 is provided with a hollow turnable shaft 3 for performing the expansion and contraction operation of the arm part 10 and a solid turnable shaft 2 which is disposed in the inside of the hollow turnable shaft 3 and connected with the first arm 20 to change the direction of the expansion and contraction of the hand arm 40 together with the first arm 20. Further, in accordance with an embodiment, the main body part 100 includes a first sensor mechanism having a first sensor 4 for detecting a home position of the solid turnable shaft 2 and a second sensor mechanism having a second sensor 5 which is disposed on the solid turnable shaft 2 for detecting a relative home position between the solid turnable shaft 2 and the hollow turnable shaft 3. In addition, a rotary joint 6 is coupled with the solid turnable shaft 2 and the second sensor 5 is electrically connected with the rotary joint 6.

In the robot 1 provided with the main body part 100 having such a structure in accordance with an embodiment of the present invention, the expansion and contraction of the arm part 10 and the turning of the arm part 10 can be performed with two above-mentioned sensor mechanisms with a high degree of positional accuracy. In addition, power feeding to the sensor mechanism is performed by the rotary joint 6 which is connected with the solid turnable shaft 2 and thus unlimited turning can be performed in a clockwise direction or in a counterclockwise direction. Therefore, a conventional time loss due to requirement of returning once in several times is prevented and thus the throughput can be improved. Further, the expansion-contraction and the turning are performed by turning two shafts and thus the number of the shafts for turning and controlling can be reduced and the structure is advantageous with respect to cost. The industrial robot 1 in accordance with an embodiment of the present invention is used under a reduced pressure atmosphere, for example, in a semiconductor producing apparatus and can be used as a low cost robot which is not limited in an arm turning quantity.

As shown in FIGS. 4 through 6, the solid turnable shaft 2 is a shaft arranged in the most inner side among shafts which are disposed in the main body part 100 and is normally formed in a solid structure and thus the turnable shaft 2 is referred to as the "solid turnable shaft" in this specification but may be formed in a structure except a solid structure, i.e., a hollow structure. An upper end portion of the solid turnable shaft 2 is attached to the first pulley 21. Therefore, when the hollow turnable shaft 3 is turned to turn the first arm 20 and the first pulley 21 is turned by the solid turnable shaft 2 which is turned such that a relative position between the first pulley 21 and the first arm 20 is not changed, the arm part 10 is capable of being turned under a state that the expansion-contraction state of the arm part 10 is maintained.

A driving force of a first motor 50 is applied to a lower end portion of the solid turnable shaft 2. In accordance with an embodiment, the first motor 50 is preferably a servomotor which is capable of mounting, as shown in FIG. 5(A), a reduction gear 51 whose reduction gear ratio is large. The driving force of the first motor 50 is transmitted through a timing belt 53 which is stretched over the pulley 52 attached to a motor shaft and a pulley 54 attached to a bottom end of the solid turnable shaft 2.

When a servomotor is used as the first motor 50, a reduction gear whose reduction gear ratio is large can be combined with the servomotor. In addition, the servomotor may be provided with a rotary encoder whose output signal provides "$2^n$" ("n" power of 2). In this case, at the time of a reset of a counter of the rotary encoder, the hollow turnable shaft 3 as well as the arm part can be set in a state after an integer number of rotation is performed based on the relationship of the reduction gear ratio. A reduction gear which is preferably used is a reduction gear whose reduction gear ratio is 1/128. In this case, by using a rotary encoder with an output signal of "$2^7$" and a reduction gear mechanism with a reduction gear ratio of 1/128, the solid turnable shaft 2 at the time of the reset of the counter becomes at the same position as an initial home position. Therefore, a rotary quantity detected afterward by the rotary encoder and a positional judgment of the solid turnable shaft 2 judged by the first and the second sensor mechanisms can be performed in the same manner as the positional judgment before the reset. As a result, the expansion-contraction and the turning of the arm part 10 can be performed without causing the home position to be varied before and after the reset even when used for a long time. The mechanical control mechanism as described above does not use a control software and thus it is advantageous in terms of costs and a control with a high degree of reliability can be performed.

The home position can be detected by the first sensor mechanism and the second sensor mechanism. However, in accordance with an embodiment, the detection of the home position is performed at the time of setting or resetting and, at the time of operation, the home position is detected by the rotary encoder provided in the above-mentioned servomotor.

As shown in FIGS. 4 through 6, the hollow turnable shaft 3 is a shaft which is arranged on an outer side of the solid turnable shaft 2 among shafts which are disposed in the main body part 100 and is literally structured in a hollow structure. An upper end portion of the hollow turnable shaft 3 is attached to the first arm 20 to cause the first arm 20 to turn and to operate such that the arm part 10 expands and contracts.

A driving force of a second motor 60 is applied to a lower end portion of the hollow turnable shaft 3. In accordance with an embodiment, the second motor 60 is preferably a servomotor and, as shown in FIG. 5(A), a reduction gear 61 whose reduction gear ratio is large can be installed. The driving force of the second motor 60 is transmitted through a timing belt 63 which is stretched over a pulley 62 attached to its motor shaft and a pulley 64 attached to a lower end of the hollow turnable shaft 3. In accordance with an embodiment, as shown in FIG. 5(A), the pulley 64 attached to the hollow turnable shaft 3 is disposed at an upper portion of the pulley 54 which is attached to the solid turnable shaft 2.

As shown in FIG. 4, a hollow fixed shaft 72 is arranged on an outer peripheral side of the hollow turnable shaft 3. The hollow fixed shaft 72 is supported by a support member 84.

Ball bearings 56, 66 and 76 which are shown as black painted portions in FIG. 4 are disposed between the solid turnable shaft 2 and the hollow turnable shaft 3 and between the hollow turnable shaft 3 and the hollow fixed shaft 72 located in an outer periphery of the hollow turnable shaft 3. Further, magnetic seals 55, 65 are preferably disposed between the solid turnable shaft 2 and the hollow turnable shaft 3 and between the hollow turnable shaft 3 and the hollow fixed shaft 72. According to the structure described above, sealing property between the shafts can be secured and thus the robot in accordance with an embodiment is preferably used, for example, under a reduced pressure atmosphere in a semiconductor production apparatus or the like.

As shown in FIG. 4 and FIG. 5(B), the solid turnable shaft 2, the hollow turnable shaft 3 and the hollow fixed shaft 72 are unified by the support member 84 and the unitary structure is operated so as to go up and down integrally by a servomotor which is a third motor 80. The third motor 80 is connected to a ball screw 85 directly or through a pulley mechanism via a joint structure 82 which comprises a coupling and a bearing fitted to the motor shaft 81. The third motor 80 is mounted on a fixed member 88 which is mounted on a housing of the main body part 100. A nut 86 which is threadedly engaged with the ball screw 85 and is fixed to the support member 84 is moved up and down along the ball screw 85 by the rotation of the third motor 80 and, as a result, the support member 84 goes up and down. As shown in FIG. 5(B) and FIG. 6, this moving up and down operation is performed along sliding members 87 such as a ball spline which are fixed between the fixed members 88 and 89. The sliding members 87 are disposed in an example shown in FIG. 6 at an angular interval of 120°.

Figure 7:
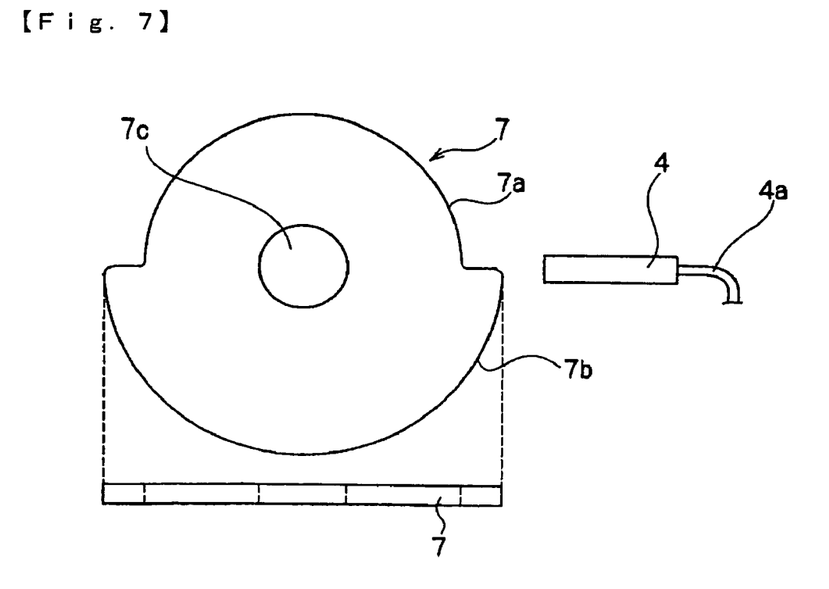
FIG. 7 is a schematic structural view showing an example of a first sensor mechanism.
Figure 8:
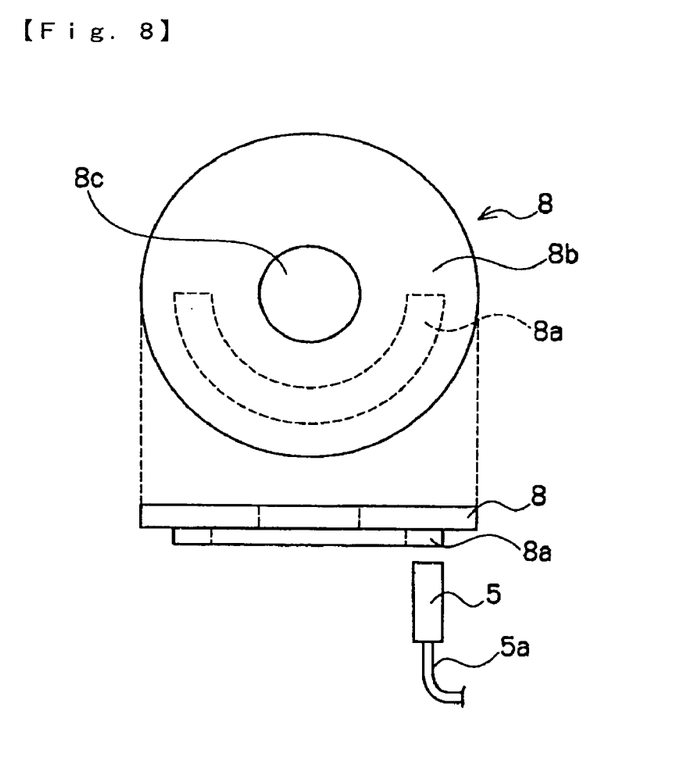
FIG. 8 is a schematic structural view showing an example of a second sensor mechanism.

Next, the sensor mechanisms will be described below. FIG. 7 is a schematic structural view showing an example of a first sensor mechanism and FIG. 8 is a schematic structural view showing an example of a second sensor mechanism. As shown in FIG. 7, the first sensor mechanism includes a first sensor 4 for detecting a home position of the solid turnable shaft 2 and a rotary member 7 as a first rotary member which causes the first sensor 4 to generate an ON/OFF signal by every 180°. The rotary member 7 is formed, as shown in FIG. 7, with a specified thickness and may be formed in two divided regions such that an outer diameter of an outer peripheral portion 7a of 180° which is one of two divided regions is different from an outer diameter of another outer peripheral portion 7b of 180°. Since the first sensor 4 is disposed with a specified space from the outer peripheral portion of the rotary member 7, the first sensor 4 detects a signal based on the difference of the outer diameters of the rotary member 7 to output an ON/OFF signal to a control mechanism (not shown). A photo-electronic sensor or the like is preferably used as the first sensor 4. In this embodiment, the notational symbol 4a is a lead wire of the first sensor 4 and the notational symbol 7c is a center hole which is provided if necessary.

The first sensor 4 is fixed to the support member 84 as shown in FIG. 4. On the other hand, the rotary member 7 is joined on an under face of the pulley 54 which is provided at the lower end of the solid turnable shaft 2 and turns together with turning of the solid turnable shaft 2.

As shown in FIG. 8, the second sensor mechanism includes the second sensor 5, which is provided in the solid turnable shaft 2 for detecting a relative home position between the solid turnable shaft 2 and the hollow turnable shaft 3, and a rotary member 8 as a second rotary member which causes the second sensor 5 to generate an ON/OFF signal by every 180°. The rotary member 8 is formed with a specified thickness and its flat face portion of 180° which is one of two circumferentially divided portions is formed with a protruded part 8a having a specified height and a specified width, which is formed at an outer peripheral portion along an outer peripheral edge, and a flat face part 8b of 180° which is the other of the two circumferentially divided portions where no protruded part is formed. The rotary member 8 formed as described above is used by being attached on the under face of the pulley 64 which is mounted on the hollow turnable shaft 3. However, the shape of the rotary member 8 as described above may be machined on the under face of the pulley 64 itself. In this case, the pulley 64 and the rotary member 8 are structured with one piece of member.

The second sensor 5 is disposed so as to be perpendicular to the flat face of the rotary member 8 and is disposed such that its tip end is capable of facing the protruded part 8a with a specified space from the protruded part 8a. The second sensor 5 detects a signal based on the presence of the protruded part 8a (difference between the protruded part and the flat face) to output an ON/OFF signal to a control mechanism (not shown). A photo-electronic sensor or the like is preferably used as the second sensor 5. In this embodiment, the notational symbol 5a is a lead wire of the second sensor 5 and the notational symbol 8c is a center hole which is provided if necessary.

The second sensor 5 is provided in the solid turnable shaft 2 as shown in FIG. 4. In this specification, the expression "provided in the solid turnable shaft 2" means a case that the second sensor 5 is directly fixed to the solid turnable shaft 2 and, in addition, as shown in FIG. 4, a case that it is mounted to a pulley 54 that is attached to the lower end of the solid turnable shaft 2 and is turned together with the solid turnable shaft 2, and a case that it is mounted to the rotary member 7 that is attached to the under face of the pulley 54.

As shown in FIG. 4, the rotary member 8 is joined to the under face of the pulley 64 which is fitted to the lower end of the hollow turnable shaft 3, or the rotary member 8 is formed on the pulley 64 itself and turns together with turning of the solid turnable shaft 2.

The rotary joint 6 is connected with the solid turnable shaft 2 as shown in FIG. 4 through 6. The second sensor 5 turning together with the solid turnable shaft 2 is electrically connected with the rotary joint 6. Therefore, the lead wire 5a of the second sensor 5 can be brought into contact with the rotary joint 6 through brushes and thus the solid turnable shaft 2 and the hollow turnable shaft 3 can be rotated endlessly in the clockwise direction or in the counterclockwise direction. As a result, a time loss due to a reverse turning once in several times is not required like a conventional robot and thus throughput can be improved.

Next, the operation of the arm part 10 will be described below. FIG. 9 is an explanatory view showing an expansion-contraction operation of the arm part. In the arm part 10, the first arm 20 and the second arm 30 have the same length and thus, as shown in FIG. 9(A), the first arm 20 and the second arm 30 are in the state where they are overlapped each other in an initial state. In accordance with this embodiment, "the same length" means that lengths between the centers of the pulleys which are located at both ends of the arms are the same each other. In this initial state, the hand arm 40 is set to be perpendicular to the second arm 30 and the longitudinal virtual line "Y" of the first arm 20 and the second arm 30 which are overlapped each other is perpendicular to the longitudinal virtual line "X" of the hand arm 40.

Next, when the hollow turnable shaft 3 is turned by an angle $\theta 1$ in one direction, the first arm 20 turns by the angle $\theta 1$ around the center point "P" of the first pulley 21. In this case, although the first arm 20 is turned by the angle $\theta 1$, the first pulley 21 is not turned because the solid turnable shaft 2 is not turned, and only the position of the second pulley 22 is rotatively moved by the angle $\theta 1$ together with the first arm 20. As a result, the second pulley 22 is turned in a reverse direction to the turning direction of the hollow turnable shaft 3 through the first belt 23. Further, the second pulley 22 is connected with the second arm 30 and, in accordance with this embodiment, the ratio of the diameters of the first pulley 21 and the second pulley 22 is set to be "2:1" and thus the second arm 30 is turned in an opposite direction to the turning direction of the first arm 20 at a speed which is twice as fast as the speed of the first arm 20 as shown in FIG. 9(B). Therefore, the angle $\theta 2$ between the first arm 20 and the second arm 30 becomes twice of the turning angle $\theta 1$ of the first arm 20.

Further, in accordance with this embodiment, the ratio of the diameters of the third pulley 31 and the fourth pulley 32 is set to be "1:2". Therefore, the hand arm 40 which is fixed to the fourth pulley 32 is turned in an opposite direction to the turning direction of the second arm 30 at a speed which is half as fast as the speed of the second arm 30 as shown in FIG.

9(B). Accordingly, the angle θ3 between the second arm 30 and the hand arm 40 becomes half of the angle θ2 between the first arm 20 and the second arm 30.

Next, when the hollow turnable shaft 3 is furthermore turned, as described above, the first arm 20 is furthermore turned about the center point "P" of the first pulley 21. As a result, the second arm 30 is turned in an opposite direction to the turning direction of the first arm 20 at a speed which is twice as fast as the speed of the first arm 20, and the hand arm 40 is turned in the opposite direction to the turning direction of the second arm 30 at a speed which is half as fast as the speed of the second arm 30 to be in a state shown in FIG. 9(C). When the hollow turnable shaft 3 is turned in the opposite direction from the state shown in FIG. 9(C), the arm part 10 returns to the state shown in FIG. 9(A) from the expanded state in FIG. 9(C) through the state in FIG. 9(B).

As described above, the turning angle θ1 of the first arm 20 and the turning angle θ3 of the hand arm 40 are the same each other and, in addition, the lengths of the first arm 20 and the second arm 30 are the same each other. Therefore, the center point "R" of the fourth pulley 32 which connects the second arm 30 with the hand arm 40 moves so as to expand and contract along the virtual line "X" and the hand arm 40 moves along the virtual line "X" without changing its longitudinal direction. Accordingly, the hand arm 40 is moved by turning of the second motor 60 so as to expand and contract in a predetermined direction.

Figure 10:
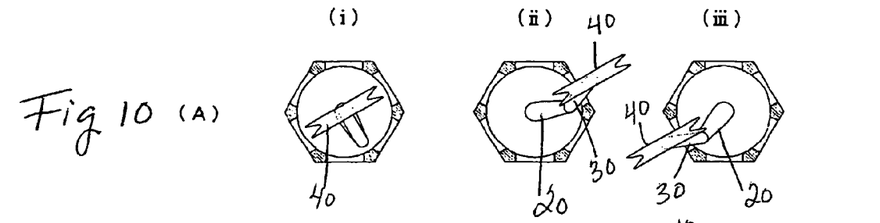
FIG. 10 is an explanatory view showing examples of turning modes and expansion-contraction modes of an arm part. Views of rows (A) through (F) show different turning modes and views of columns (i) through (iii) show different expansion-contraction modes.

FIG. 10 is an explanatory view showing examples of turning modes and expansion-contraction modes of arm parts. In FIG. 10, views of rows (A) through (F) show different turning modes, and views of columns (i) through (iii) show different expansion-contraction modes. The (i)-column shows the initial state, the (ii)-column shows an expanded state in one direction, and the (iii)-column shows an expanded state in the opposite direction. In other words, in the initial state shown in the (i)-column, when the hollow turnable shaft 3 is turned in a normal direction, the state shown in the (ii)-column is obtained and, when it is turned in a reverse direction, the state shown in the (iii)-column is obtained.

The states shown in the rows (A) through (F) are the modes where the arm part 10 is turned around its center. When the solid turnable shaft 2 and the hollow turnable shaft 3 are turned without changing their relative position, the arm part 10 performs turning without performing an expansion-contraction operation. FIG. 10 shows modes of an embodiment in which the arm part 10 is supposed to be disposed in a hexagonal load lock chamber. In the (i)-column state, when the arm part 10 is turned at a prescribed angle such that the longitudinal direction of the hand arm 40 is orientated to a predetermined gate among six gates, six types of modes shown in the rows (A) through (F) are obtained based on the angle of the longitudinal direction of the hand arm 40.

After the arm part 10 is turned such that the hand arm 40 faces a specified gate, only the hollow turnable shaft 3 is turned in a normal direction or in a reverse direction. As a result, the hand arm 40 can be expanded and contracted from the (i)-column state to the (ii)-column state or the (iii)-column state.

In accordance with an embodiment, the position of the solid turnable shaft 2 and the relative position of the hollow turnable shaft 3 to the solid turnable shaft 2 can be detected by the first sensor mechanism and the second sensor mechanism. In other words, as described in FIGS. 7 and 8, the rotary member 7 of the first sensor mechanism and the rotary member 8 of the second sensor mechanism are respectively divided into two regions of 180°.

In the solid turnable shaft 2, a difference between the row (A) and the row (D) in FIG. 10, a difference between the row (B) and the row (E), and a difference between the row (C) and the row (F) can be distinguished based on whether the first sensor 4 is located on the side of the outer peripheral portion 7a of the rotary member 7 shown in FIG. 7 or on the side of the outer peripheral portion 7b. The solid turnable shaft 2 has performed an integral turning when the solid turnable shaft 2 returns to the mode shown in the row (A) again from the mode in the row (A) through the mode in row (D). Further, the distinction and the control, for example, in the rows (A) through (C) which correspond to the same side of the outer peripheral portion 7a can be performed by means of that, for example, a rotary encoder is mounted on the first motor 50 to distinguish or control based on its output signal.

Further, in the robot 1 in accordance with an embodiment, a home position of the arm part 10 can be determined. For example, a home position of the solid turnable shaft 2 is determined at a boundary between the outer peripheral portion 7a and the outer peripheral portion 7b on a side where the rotary member 7 is changed from the outer peripheral portion 7b to the outer peripheral portion 7a when the rotary member 7 is turned in the clockwise direction in FIG. 7. Further, a home position of the hollow turnable shaft 3 is determined at a boundary between the protruded part 8a and the flat face part 8b on a side where the rotary member 8 is changed from the protruded part 8a to the flat face part 8b when the rotary member 8 is turned in the clockwise direction in FIG. 8. The home positions can be recreated any time or if necessary by storing the above-mentioned home positions into a memory of a control mechanism.

In the robot 1 in accordance with an embodiment of the present invention, it is preferable to install a rotary encoder in the first motor 50 for turnably driving the solid turnable shaft 2 and in the second motor 60 for turnably driving the hollow turnable shaft 3 respectively. As a result, it can be judged that the arm part 10 is located in either of the states shown in FIG. 10 with the use of turning quantities detected with the rotary encoders and the sensor mechanisms shown in FIGS. 7 and 8.

Any of an incremental encoder and an absolute encoder is used as the rotary encoder. When the incremental encoder is used, pulses are outputted in response to a turning angle and the number of the pulses is detected with a counter. The counter will be reset at some future time. When the counter is reset, if the position of the arm part 10 should be different from the initial home position, positional judgment after the reset becomes inaccurate in control.

According to an embodiment of the present invention, as described above, when a rotary encoder (incremental encoder) whose output signal is "2"" is installed, a reduction gear ratio of a reduction gear of a servomotor for driving the solid turnable shaft 2 is set to be 1/128. Therefore, when a counter for the incremental encoder is reset, the arm part 10 always becomes in a state of integral turning based on the relationship with the reduction gear ratio. As a result, the position of the arm part 10 at the time of resetting of the counter becomes the same as the initial home position, and thus the positional judgment of the arm part 10 which is performed with the turning quantity detected with the rotary encoder and the sensor mechanisms shown in FIGS. 7 and 8 can be performed in the same manner as the positional judgment before the counter is reset. Accordingly, the expansion-contraction and the turning of the arm part can be performed without causing the home position to be inaccurate before and after the resetting even when used for a long time. Since the mechanical control mechanism described above is not based on a control software, it is advantageous in terms of costs and a control with a high degree of reliability can be performed.

Figure 11:
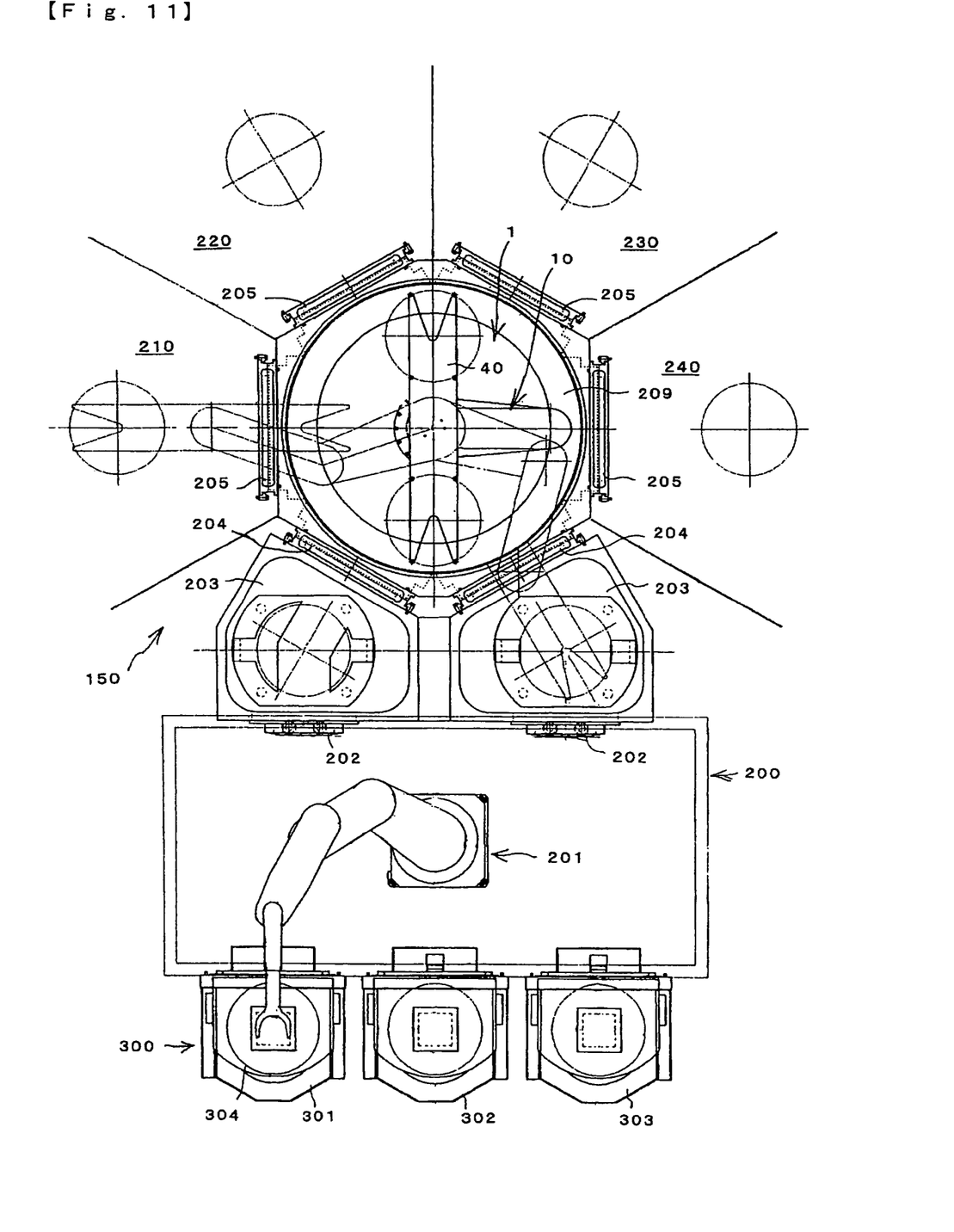
FIG. 11 is a schematic plan view showing an example where an industrial robot in accordance with an embodiment of the present invention is used in a production process for a semiconductor.
Figure 12:
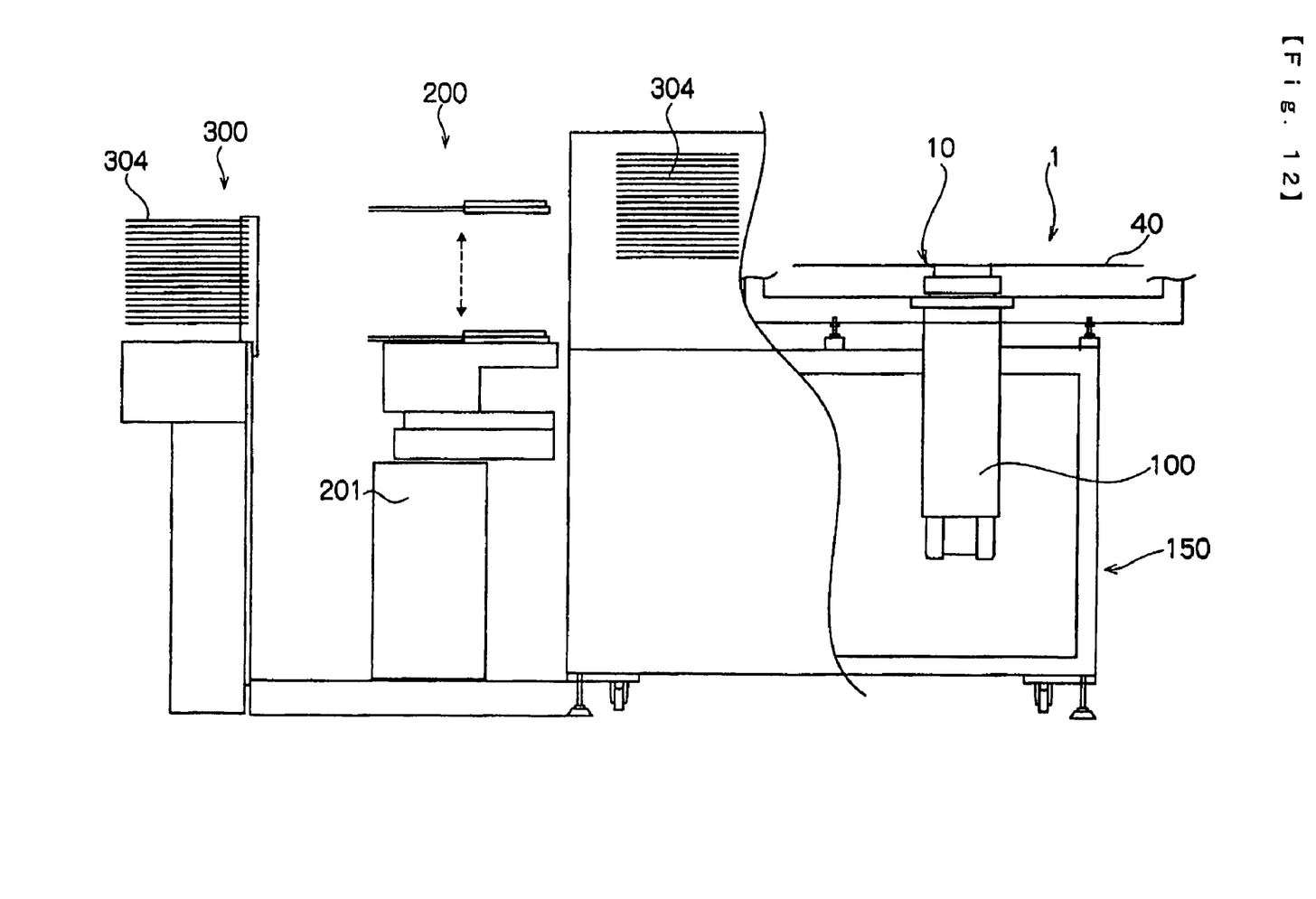
FIG. 12 is a schematic side view showing an apparatus shown in FIG. 11.

FIG. 11 is a schematic plan view showing an example where an industrial robot in accordance with an embodiment of the present invention is used in a production process for a semiconductor. FIG. 12 is a schematic side view of the example shown in FIG. 11. An apparatus shown in FIG. 11 is a collective processing apparatus 150 in a production process for a semiconductor. A load lock chamber 209 which can be depressurized is arranged at a center of the apparatus and the robot 1 in accordance with the present invention is installed.

Processing chambers which are divided into six chambers in a circumferential direction are arranged around the load lock chamber 209. Four chambers 210, 220, 230 and 240 are vacuum processing chambers and two chambers 203 are accommodating chambers for transferring a wafer from outside of the collective processing apparatus. Further, the notational symbol 201 is a robot for transferring a wafer 304 from the outside of the collective processing apparatus. In this collective processing apparatus 150, gates 202, 204 and 205 are arranged at an entrance of the respective chambers and taking-in or taking-out of a wafer 304 from the respective processing chambers are executed by performing opening/closing of the gates 202, 204 and 205.

With regard to a structure except the robot 1 in accordance with the present invention, the carrier robot 201 installed in a carrier robot chamber 200 operates between wafer mounting racks 301, 302 and 303 (hereinafter, shown with the notational symbol 300) in which wafers 304 are stored and the accommodating chambers 203.

The robot 1 in accordance with the present invention is installed in the collective processing apparatus as described above. In the robot 1 in accordance with the present invention, the arm part 10 can be turned in an unlimited manner and the expansion-contraction and the turning of the arm part 10 can be controlled by two sensor mechanisms with a high degree of positional accuracy. As a result, a time loss due to requirement of returning once in several times is eliminated and thus the throughput can be improved. Further, the expansion-contraction and the turning are performed by turning two shafts, i.e., the solid turnable shaft 2 and the hollow turnable shaft 3, and thus the number of the shafts for turning and controlling is reduced and the structure of the device is advantageous in terms of costs. The industrial robot 1 in accordance with an embodiment of the present invention is used under a reduced pressure atmosphere, for example, in a semiconductor producing apparatus and can be used as a low cost robot, which is not limited in an arm turning quantity.

While the description above refers to particular embodiments of the present invention, it will be understood that many modifications may be made without departing from the spirit thereof The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot comprising:
 a main body part;
 an arm part comprising a first arm, a second arm and a hand arm which are connected in this order from the main body part and which is turnably driven to expand and contract so that the hand arm is moved in a direction;
 a first turnable shaft which is disposed in the main body part for performing an expansion-contraction operation of the arm part;
 a second turnable shaft which is disposed within the first turnable shaft for changing an expansion-contraction direction of the hand arm together with the first arm;
 a first sensor mechanism which is provided in the main body part and which includes a first sensor for detecting a home position of the second turnable shaft;
 a second sensor mechanism which is provided in the second turnable shaft and which includes a second sensor for detecting a relative home position between the second turnable shaft and the first turnable shaft; and
 a rotary joint which is connected with the second turnable shaft and is electrically connected with the second sensor.

2. The industrial robot according to claim 1, wherein the first sensor mechanism comprises a first rotary member which causes the first sensor to generate an ON/OFF signal by every 180° of rotation of the second shaft, and the second sensor mechanism comprises a second rotary member which causes the second sensor to generate an ON/OFF signal by every 180° of rotation of the first shaft.

3. The industrial robot according to claim 1, wherein the second turnable shaft is driven by a servomotor having a reduction mechanism and a rotary encoder.

4. The industrial robot according to claim 3, wherein a reduction gear ratio of the reduction mechanism is set to be 1/128 and an output signal of the rotary encoder is $2''$.

5. The industrial robot according to claim 1, wherein
 the first arm comprises a first pulley which is connected to the second turnable shaft on the main body part side, a second pulley which is disposed on the second arm side and connected with the second arm, and a first belt which is stretched over the first pulley and the second pulley; and
 the second arm comprises a third pulley which is disposed at a concentric position with the second pulley, a fourth pulley which is disposed on the hand arm side and connected with the hand arm, and a second belt which is stretched over the third pulley and the fourth pulley.

6. The industrial robot according to claim 5, wherein the first turnable shaft is connected with the first arm to turnably drive the first arm, a turning angle ratio of the first pulley, the second pulley and the fourth pulley is set to be "1:2:1", and the arm part performs an expansion-contraction operation with a direction of the hand arm being maintained constant when only the first turnable shaft is turnably driven.

7. The industrial robot according to claim 1, further comprising a drive source for moving the first turnable shaft and the second turnable shaft in a height direction.

8. The industrial robot according to claim 1, wherein the first turnable shaft is a hollow turnable shaft and the second turnable shaft is a solid turnable shaft which is disposed within the hollow turnable shaft.

9. The industrial robot according to claim 8, wherein a magnetic seal is provided between the solid turnable shaft and the hollow turnable shaft, and another magnetic seal is provided between the hollow turnable shaft and a hollow fixed shaft which is disposed on an outer peripheral side of the hollow turnable shaft.

* * * * *